(12) United States Patent
Wilkins

(10) Patent No.: US 7,431,705 B2
(45) Date of Patent: Oct. 7, 2008

(54) DIE-FIRST MULTI-CHIP MODULES AND METHODS OF MANUFACTURE

(75) Inventor: Wendy Lee Wilkins, Eau Claire, WI (US)

(73) Assignee: Union Semiconductor Technology Corporation, Plymouth, MN (US)

( * ) Notice: Subject to any disclaimer, the term of this patent is extended or adjusted under 35 U.S.C. 154(b) by 562 days.

(21) Appl. No.: 10/724,981

(22) Filed: Nov. 30, 2003

(65) Prior Publication Data

US 2005/0115065 A1 Jun. 2, 2005

(51) Int. Cl.
*A61H 1/00* (2006.01)
(52) U.S. Cl. .......................................... 601/46; 601/47
(58) Field of Classification Search ............. 601/46–47; 235/492; 156/250
See application file for complete search history.

(56) References Cited

U.S. PATENT DOCUMENTS 6,428,650 B1 * 8/2002 Chung ........................ 156/250

2004/0178279 A1 * 9/2004 Gundlach ..................... 235/492

* cited by examiner

*Primary Examiner*—Michael A. Brown
(74) *Attorney, Agent, or Firm*—Jones Day

(57) ABSTRACT

Methods of making a multi component module (130) utilize a reusable carrier substrate (111) where the reusable carrier substrate (111) is light transmissive in a frequency range of an adhesive (112) that is ablated by light of a certain frequency such as light from an excimer laser (122). An electronic component (118), such as a chip, die, or passive or active component, is adhered to the reusable carrier substrate (111) with the adhesive (112). An interconnect structure (117) is fabricated on the electronic component (118) to form a multi component module (130). The excimer laser (122) illuminates the reusable carrier substrate (111) with light in the frequency range after fabricating the interconnect structure (117) to ablate the adhesive (112) to remove the multi component module (130) from the reusable carrier substrate (111).

31 Claims, 7 Drawing Sheets

DIE-FIRST MULTI-CHIP MODULES AND METHODS OF MANUFACTURE

FIELD OF THE INVENTION

This invention relates generally to methods for fabricating die-first, also referred to as chips first, multi-chip modules or packages, MCMs or MCPs, and single-chip modules, SCMs. Specifically, the invention relates to a set of processes for manufacturing die-first MCM's in large form factor for high volume manufacturing.

BACKGROUND OF THE INVENTION

A typical MCM package includes multiple layers of both dielectrics, such as polyimide, and conductors, such as copper. The die can be on the bottom, known as the die first case, or on the top, known as the die last case. The base substrate is usually ceramic in the die last case or silicon, in the die first case. In the die first case, the connection to the die is made directly by the thin film. In contrast, the chips are attached in the die last case via techniques such as wire bonding, solder balls, or stab bonding, or conductive adhesives.

There are several commonly used methods for fabrication of die first MCMs. One technique is to use an adhesive to attach the integrated circuits, I.C's, to a backing wafer. If the gaps between I.C.'s are large, either a stencil or some type of polymer fill material is used to fill the gaps between the I.C.'s. The thin film interconnect is built over the top of the I.C.'s, and the backing wafer becomes an integral part of the module. Others have used a method in which the I.C.s are attached to glass substrates with a heat releasable adhesive.

There are several disadvantages to the foregoing techniques. The carrier substrate is not reusable, which increases product costs. The carrier substrates tend to be relatively small, reducing the number of multi-chip modules that can be constructed on a single substrate. Production costs are related to the number of individual modules that can be put on a single substrate; therefore, having a small number of modules on a substrate increases the overall production costs. These techniques also require expensive semiconductor-processing equipment to handle wafers. By reducing the number of substrates handled, production labor costs are reduced. Use of integrated circuit processing chemicals increases the chemical costs related to processing. Thermal characteristics of prior techniques are undesirable because the integrated circuit is insulated by the carrier substrate.

Thus, there is a need for novel methods that are useful for producing MCMs in volume at lower cost.

There is a further need to provide novel methods that can allow the substrate to be used again to make another set of MCMs.

There is a further need to provide novel methods that can accommodate a large panel allowing a larger quantity of MCMs to be built on a single substrate.

There is a further need to provide novel methods that can allow for increasing the number of modules per substrate thus reducing the overall production cost per substrate.

There is a further need to provide novel methods that allow for the use of printed circuit board (PCB) equipment for the photolithography and metal patterning operations to reduce cost.

There is a further need to provide novel methods that can manufacture a MCM that has better thermal characteristics because the electronic components such as integrated circuits are not insulated by the carrier substrate.

SUMMARY OF THE INVENTION

The present invention solves these needs and other problems in the field of multi-chip module manufacturing methods by providing, in most preferred aspects, a method of making a module including: providing a reusable carrier substrate, with the reusable carrier substrate being light transmissive in a frequency range; providing a first electronic component; adhering the first electronic component to the reusable carrier substrate with an adhesive that is able to be ablated by light in the frequency range; fabricating an interconnect structure on the at least one electronic component to form the module; and illuminating the reusable carrier substrate with light in the frequency range, after fabricating the interconnect structure and after adhering the first electronic component, to ablate the adhesive to remove the module from the reusable carrier substrate to allow reuse of the reusable carrier substrate.

In other aspects of the present invention, the method provides a second electronic component and provides for adhering the second electronic component to the reusable carrier substrate with an adhesive that is able to be ablated by light in the frequency range.

In other aspects of the present invention, the method provides for adhering the second electronic component with the adhesive used to adhere the first electronic component.

In other aspects of the present invention, the method provides for illuminating the reusable carrier substrate with light in the frequency range, after fabricating the interconnect structure, to ablate the adhesive to remove the module from the reusable carrier substrate with the module being free of a carrier substrate to allow for improved thermal characteristics.

In other aspects of the present invention, the method provides for a reusable carrier substrate having a first thermal expansion coefficient in a thermal expansion coefficient range, with the first electronic component having a second thermal expansion coefficient in the thermal expansion coefficient range.

In other aspects of the present invention, the method provides for forming alignment marks on the reusable carrier substrate.

In other aspects of the present invention, the method provides for etching alignment marks into the reusable carrier substrate.

In other aspects of the present invention, the method provides for adhering the first electronic component to the reusable carrier substrate with an adhesive made from bisbenzocyclobutene.

In other aspects of the present invention, the method provides for extruding the adhesive on the reusable carrier substrate.

In other aspects of the present invention, the method provides for spinning the adhesive on the reusable carrier substrate.

In other aspects of the present invention, the method provides for a reusable carrier substrate made from glass.

In other aspects of the present invention, the method provides for a reusable carrier substrate made from quartz.

In other aspects of the present invention, the method provides for a reusable carrier substrate made from fused silica.

In other aspects of the present invention, the method provides forming thin film interconnects on the first electronic component.

In other aspects of the present invention, the method provides for the first electronic component being in the form of an integrated circuit.

In other aspects of the present invention, the method provides for the second electronic component in the form of an integrated circuit.

In other aspects of the present invention, the method provides for fabricating the interconnect structure by laminating a dielectric material to the first electronic component.

In other aspects of the present invention, the method provides for fabricating the interconnect structure by forming thin film interconnects to the first electronic component.

In other aspects of the present invention, the method provides for the next level of interconnection by fabrication of a top bonding layer that is connected to the first electronic component.

In other aspects of the present invention, the method provides for fabricating the interconnect structure on the first electronic component in the form of a thin film interconnect to form a ground plane, one or more power planes, and one or more signal layers.

In other aspects of the present invention, the method provides for fabricating the interconnect structure in the form of a dielectric and a conductor.

In other aspects of the present invention, the method provides for fabricating the interconnect structure on the first electronic component in the form of a dielectric and a conductor with the dielectric in the form of a polyimide.

In other aspects of the present invention, the method provides for fabricating the interconnect structure in the form of a dielectric and a conductor, with the dielectric in the form of a bisbenzocyclobutene.

In other aspects of the present invention, the method provides preparing the module for further processing free of a carrier substrate.

In other aspects of the present invention, the method provides illuminating the reusable carrier substrate with light in the 248 nm range.

In other aspects of the present invention, the method provides illuminating the reusable carrier substrate with light in the 308 nm range.

In other aspects of the present invention, the method provides illuminating the reusable carrier substrate with light from an excimer laser.

In other aspects of the present invention, the method provides a plurality of electronic components with at least one of the plurality of electronic components is connected to the first electronic component and at least one of the plurality of electronic components is not connected to the first component.

In other aspects of the present invention, the method provides separating the first electronic component and the at least one of the plurality of electronic components connected to the first electronic component from the at least one electronic component not connected to the first electronic component by etching.

In other aspects of the present invention, the method separating the first electronic component and the at least one of the plurality of electronic components connected to the first electronic component from the at least one electronic component not connected to the first electronic component after illuminating the reusable carrier substrate with the light in the frequency range by cutting with a knife or with a laser.

In other aspects of the present invention, a method of making a module with a heat sink includes: providing a reusable carrier substrate, with the reusable carrier substrate being light transmissive in a frequency range; providing a first electronic component; adhering the first electronic component to the reusable carrier substrate with an adhesive that is able to be ablated by light in the frequency range; fabricating an interconnect structure on the first electronic component to form the module; illuminating the reusable carrier substrate with light in the frequency range, after fabricating the first interconnect and after adhering the first electronic component, to ablate the adhesive to remove the module from the reusable carrier substrate to allow reuse of the reusable carrier substrate; and attaching a heat spreader to the module removed from reusable carrier substrate.

It is an object of the invention to provide a novel procedure for fabricating die first MCMs in a large form factor.

It is a further object of the present invention to provide a novel method that allows die first MCMs to be mass-produced.

These and further objects of the present invention will become clearer in light of the following detailed description of illustrative embodiments of this invention described in connection with the drawings.

DESCRIPTION OF THE DRAWINGS

The illustrative embodiments may best be described by reference to the accompanying drawings where.

Figure 1:
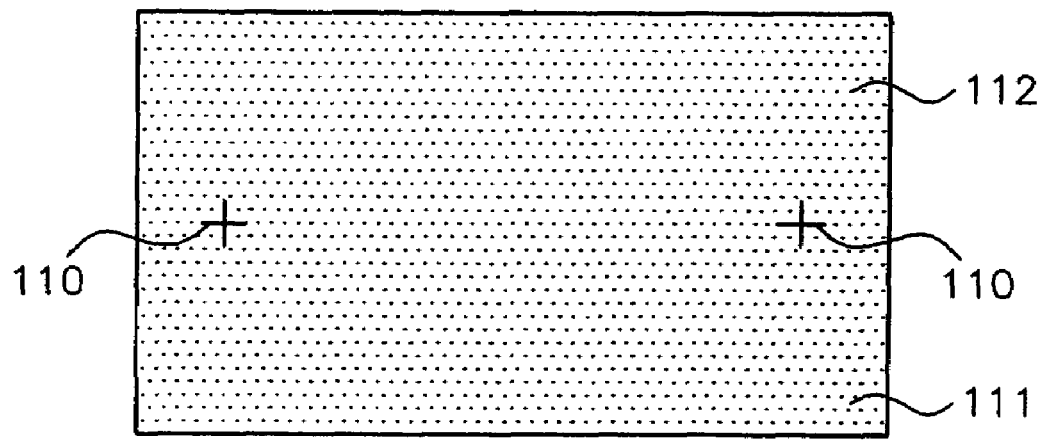
FIG. 1 shows a top view of a reusable carrier substrate with alignment marks according to the preferred teachings of the present invention.

All figures are drawn for ease of explanation of the basic teachings of the present invention only; the extensions of the figures with respect to number, position, relationship, and dimensions of the parts to form the preferred embodiment will be explained or will be within the skill of the art after the following description has been read and understood. Further, the exact dimensions and dimensional proportions to conform to specific current, voltage, capacitance, force, weight, strength, and similar requirements will likewise be within the skill of the art after the following description has been read and understood.

Where used in the various figures of the drawings, the same numerals designate the same or similar parts. Furthermore, when the terms "end," "bottom," "first," "second," "left," "right," "top," and similar terms are used herein, it should be understood that these terms have reference only to the structure shown in the drawings as it would appear to a person viewing the drawings and are utilized only to facilitate describing the illustrative embodiments.

DESCRIPTION OF THE PREFERRED EMBODIMENTS

A reusable carrier substrate used to construct die first single-chip modules, die first multi-chip modules or packages, component first single-component modules and component first multi-component modules, collectively known as MCMs 130, according to the preferred teachings of the present invention is shown in the drawings and generally designated 111. The construction of MCMs 130 will be discussed with reference to construction methods 200 shown diagrammatically in FIG. 8 with reference to FIGS. 1, 2, 3, 4, 5, 6, and 7 that show MCMs 130 in various stages of manufacture.

Refer now to FIG. 1, which shows the reusable carrier substrate 111 having alignment marks 110. The reusable carrier substrate 111 is made from a material that is transparent to a light of a specified frequency range associated with an ablation of an adhesive 112. The adhesive 112 is shown in FIGS. 2, 3, 4, 5 6, and 7.

According to the preferred teachings of the present invention, the reusable carrier substrate 111 is made from glass, but any other suitable carrier substrate material can be used that is transparent in a specified frequency range. According to preferred teachings of the present invention, the reusable carrier substrate 111 is transparent in the 248 nm or 304 nm wavelength ranges.

According to the preferred teachings of the present invention, the reusable carrier substrate 111 has a coefficient of thermal expansion that is compatible with the dies, chips or components used in the construction of a multi-chip module, MCM 130. According to the preferred teachings of the present invention, the material that the reusable carrier substrate 111 is constructed from has a coefficient of thermal expansion (CTE) that is closely matched to the coefficient of thermal expansion (CTE) of silicon. Quartz, fused silica, or specialty glass such as VYCOR from Corning Incorporated are examples of materials that can be used to construct the reusable carrier substrate 111 according to the preferred teachings of the present invention.

Figure 8:
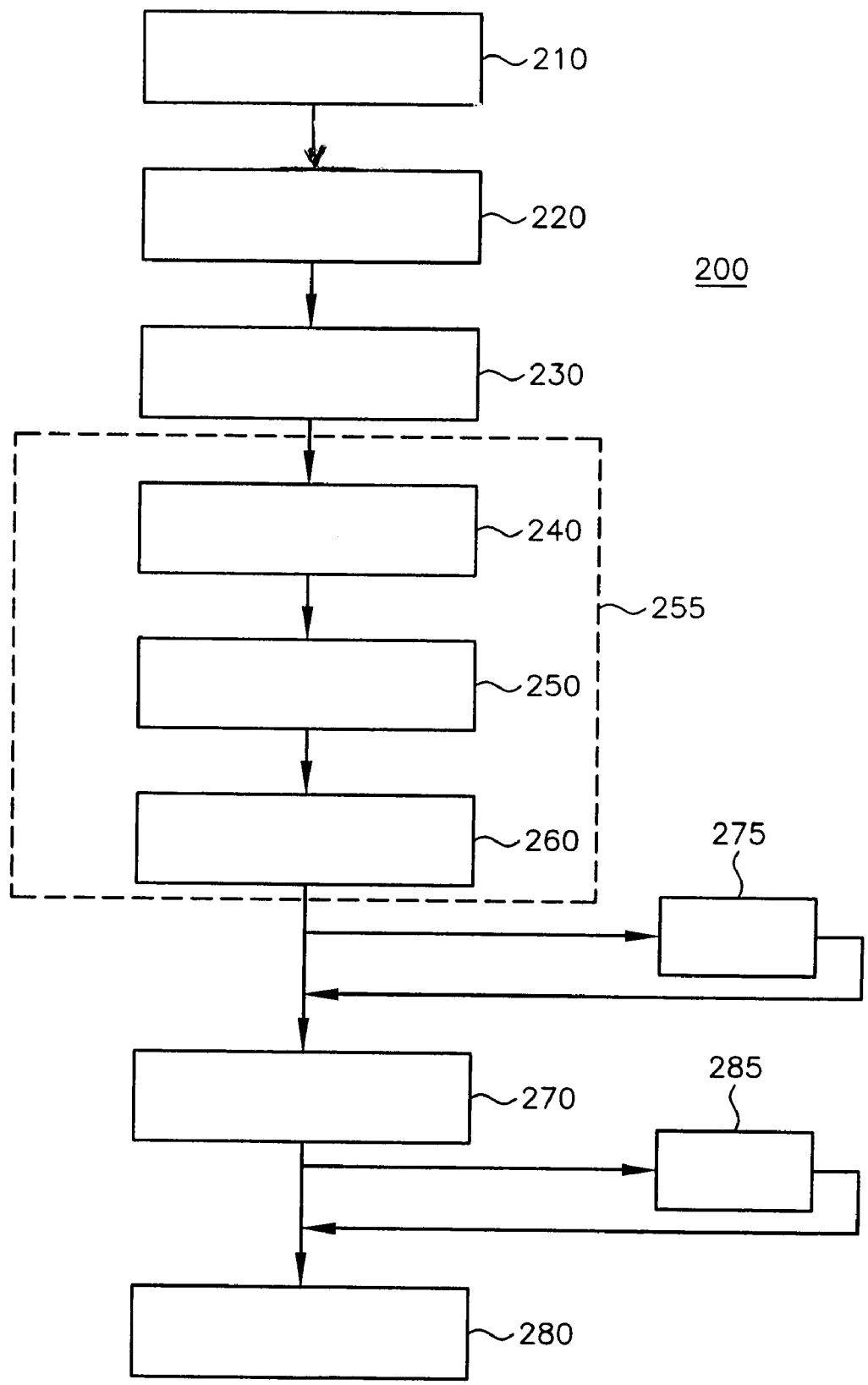
FIG. 8 shows a schematic flow diagram of methods of fabricating an MCM according to the preferred teachings of the present invention.

As diagrammatically illustrated in box 210, shown in FIG. 8, alignment marks 110 are formed on the reusable carrier substrate 111. According to the preferred teachings of the present invention, the alignment marks 110 are deposited onto the reusable carrier substrate 111. In an alternate embodiment, according to the preferred teachings of the present invention, alignment marks 110 are etched into the reusable carrier substrate 111.

The alignment marks 110 are used for die placement and location of thin film interconnects. By way of example and not limitation, the alignment marks 110 have placement accuracy on the reusable carrier substrate 111 of one micron and are 170 microns wide. Those skilled in the art will appreciate that other alignment marks may be used such as a circle 508 microns in diameter and that the size and shape may be dependent on the pick and place equipment, or other handling equipment used.

Figure 2:
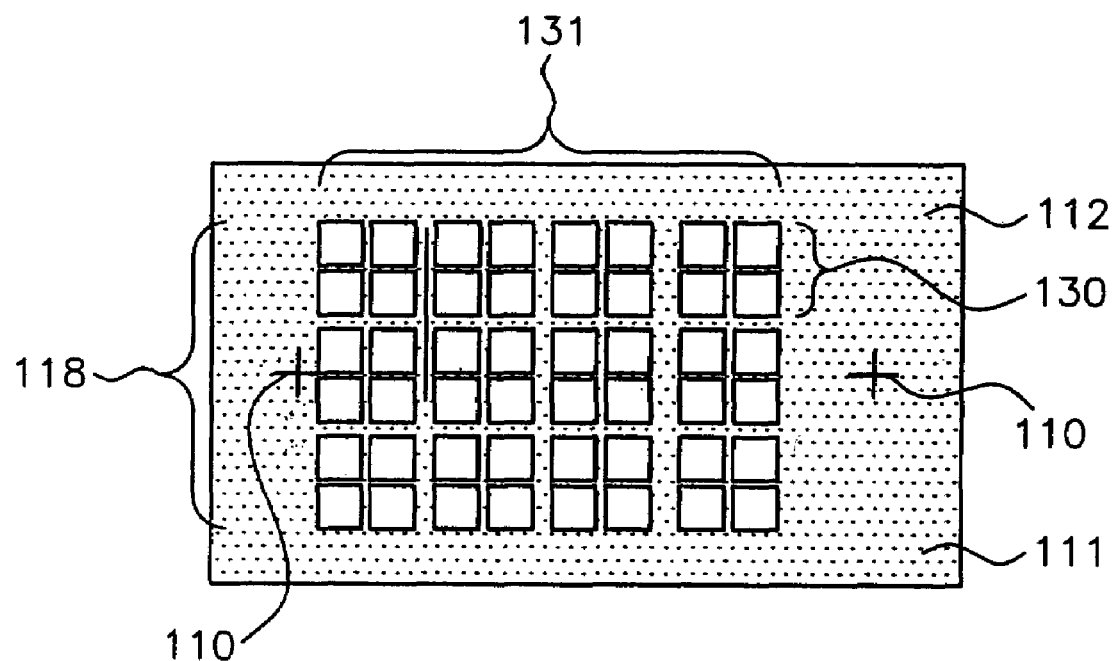
FIG. 2 shows a top view of a multicomponent module including a plurality of electronic components on a reusable carrier substrate.

Refer now to FIG. 2, which shows, by way of example, the reusable carrier substrate 111 with components in a component layer 118 attached by adhesive 112 to make multiple modules 131 having twelve four chip MCMs 130. According to the preferred teachings of the present invention, the size of the reusable carrier substrate 111 is determined by the equipment set as well as the desired dimensions of the MCM 130. The equipment set is the production and handling equipment used to process the MCM 130. As a general rule, the larger the size of the reusable carrier substrate 111, the greater the number of MCMs 130 that can be fabricated at a time on a single reusable carrier substrate 111. The size of the reusable carrier substrate 111 can be for example, 8 inches×8 inches (20.5 cm×20.5 cm ) or 24 inches×24 inches (61 cm×61 cm ) and could be sized to fit into standard printed circuit board or flat panel display manufacturing and handling equipment.

These size examples are not by way of limitation but by way of example and those skilled in the art will recognize that larger or smaller size MCMs 130 can be fabricated without deviating from the spirit and scope of the invention.

Figure 3:
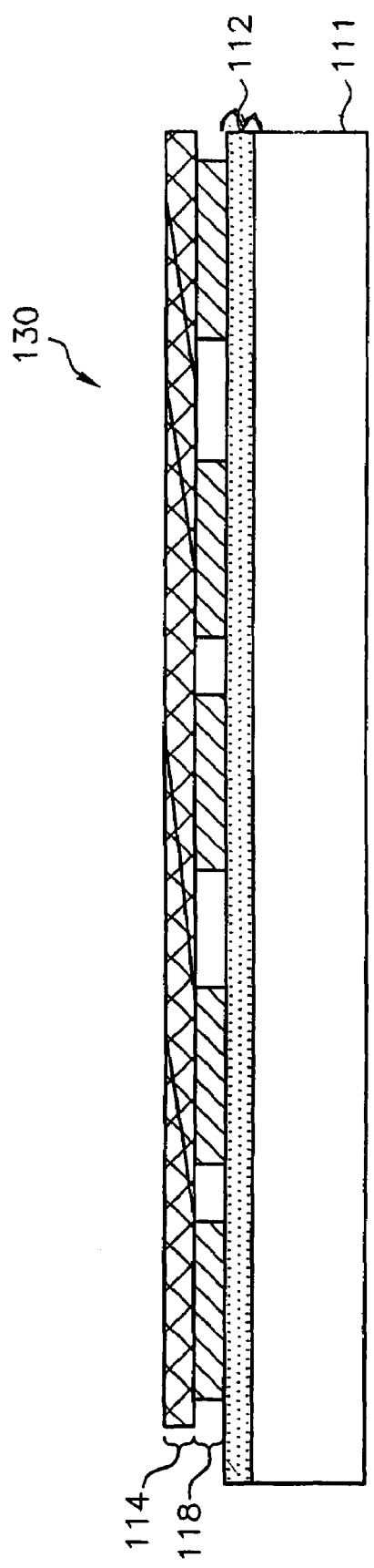
FIG. 3 shows a side view of a reusable chip carrier with an adhesive layer attached with multiple component attached to the dielectric layer.

Refer now to FIG. 3, which shows a side view of an MCM 130 illustrating the reusable carrier substrate 111, the adhesive 112, the electronic components, such as a first electronic component and or a second electronic component, or a plurality of electronic components, in the component layer 118, and the dielectric layer 114 according to the preferred teachings of the present invention. As diagrammatically illustrated by box 220, shown in FIG. 8, the adhesive 112 is placed on the reusable carrier substrate 111. According to the preferred teachings of the present invention, the adhesive 112 is a thin layer of the adhesive, such as bisbenzocyclobutene (BCB) or CYCLOTENE™ from The Dow Chemical Company, which is extruded or spun on the reusable carrier substrate 111. The adhesive 112 must be able to be ablated by a certain wavelength of light. According to the preferred teachings of the present invention, ablation is a process of removing a material by exposure to photons of a certain frequency. For example, according to the preferred teachings of the present invention, a 248 nm KrF or 308 nm XeCl excimer laser light ablates BCB. Those skilled in the art will appreciate that other light sensitive adhesives are within the spirit and scope of the invention.

Electronic components in the component layer 118 are placed onto the reusable carrier substrate 111 as diagrammatically illustrated by box 230, shown in FIG. 8. According to the preferred teachings of the present invention, electronic components in the component layer 118 are placed onto the reusable carrier substrate 111 using the alignment marks 110 as a reference. The electronic components in the component layer 118 are fixed to the reusable carrier substrate 111 by the adhesive 112. The initial electronic component placement can be done automatically using image recognition techniques as is known in the art. According to the preferred teachings of the present invention, the electronic components in the component layer 118 can be semiconductor die, semiconductor chips, integrated circuits, active or passive components, Micro Electro Mechanical Systems (MEMS) or sensors or any combination of the above. There is no restriction on the thickness of the electronic components in the component layer 118, although, according to the preferred teachings of the present invention, the difference in thickness between components should not exceed 25 microns. The electronic components in the component layer 118 can be provided in a waffle pack, tape and reel or diced from a wafer.

As diagrammatically illustrated by box 240, shown in FIG. 8, the dielectric layer 114 can be deposited on the electronic components in the component layer 118 leaving voids between them. In one example embodiment according to the preferred teachings of the present invention, the dielectric layer 114 serves a planarizing function, which functions to level out the next layers to be constructed. According to the preferred teachings of the present invention, the dielectric layer 114 is KAPTON film coated with adhesive from E.I. du Pont de Nemours and Company that is laminated across the surface of the electronic components in the component layer 118.

Figure 4:
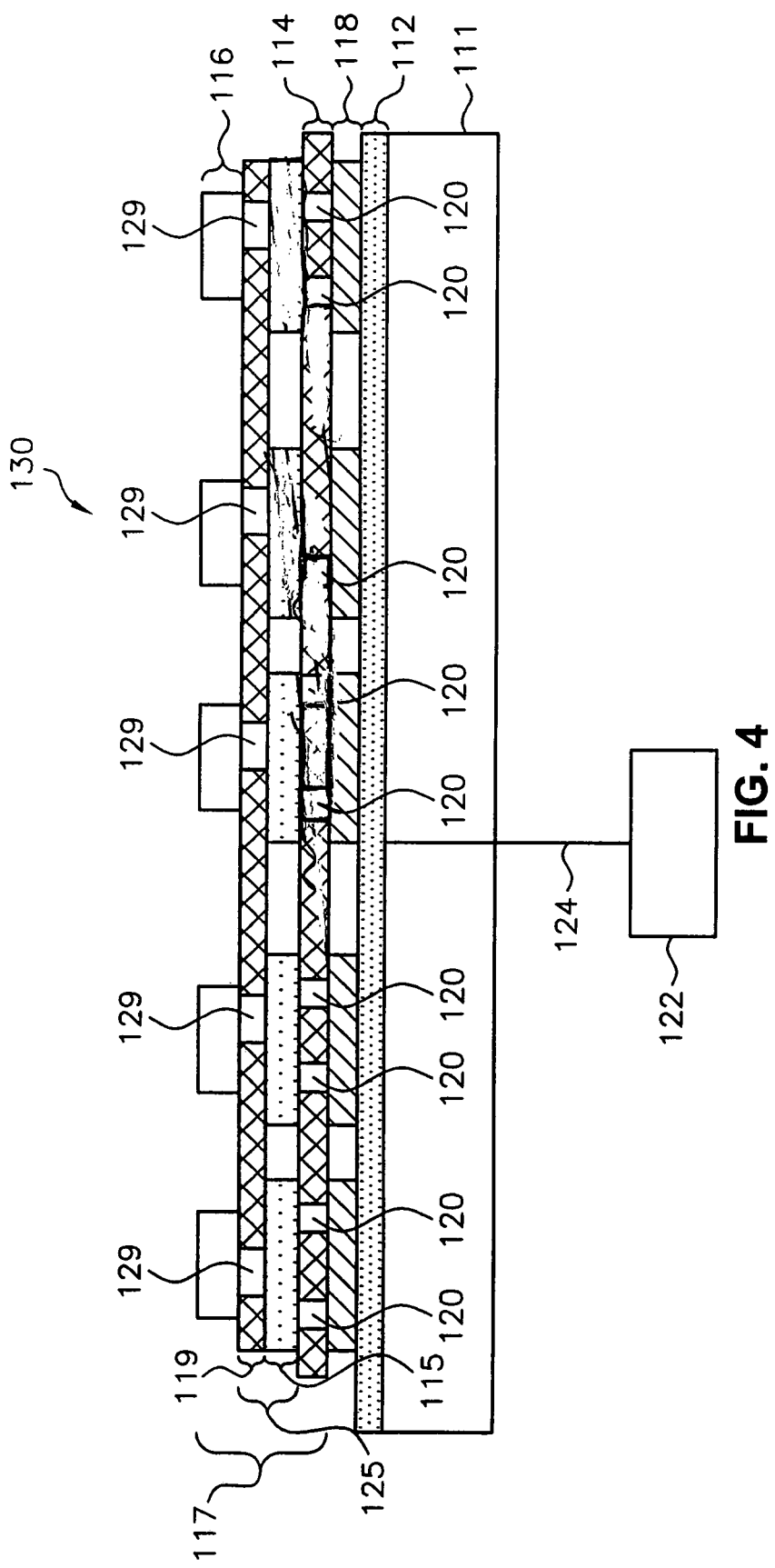
FIG. 4 shows a side view of a multicomponent module being detached by an excimer laser.

Refer now to FIG. 4, which shows a side view of a light source 122, an illuminating beam 124, the reusable carrier substrate 111, the adhesive 112, the electronic components in the component layer 118, the dielectric layer 114, and an interconnect structure 117. As diagrammatically shown in box 255, shown in FIG. 8, the interconnect structure 117 is fabricated including, in the preferred form, an electrical interconnect layer 125, and a top bonding layer 116. The electrical interconnect layer 125, includes, by way of example, a conducting layer 115, and an interconnect dielectric layer 119 serving an isolation and insulating function. The dielectric layer 119 has vias 129 to allow interconnection in a well-known manner. Those skilled in the art will recognize that any compatible combination of interconnect technologies, including fewer or more layers, are within the spirit and scope of the invention. The conducting layer 115 and the interconnect dielectric layer 119 are shown for simplicity, but each electrical interconnect layer 125 can include a dielectric and a conductor. The dielectric layer 119 is typically constructed from polyimide or bisbenzocyclobutene (BCB). The conductors of the conducting layer 115 are commonly formed out of copper, aluminum, or gold and can be clad with other metals such as titanium or chrome for adhesion purposes, as is known in the art.

The interconnect structure 117 is formed by using standard thin film processing techniques such as laser or reactive ion etch (RIE) to form the vias 120 in the laminate film and circuit formation by sputtering and etchback or pattern plating. According to the preferred teachings of the present invention, the interconnect structure 117 includes multiple electrical interconnect layers 125 to form ground planes, power planes, signal layers, and a pad layer to interconnect the electronic components in the component layer 118.

According to the preferred teachings of the present invention, the method of fabricating the interconnect structure 117 includes: laminating the dielectric layer 114 across the surface of the electronic components in the component layer 118 as diagrammatically illustrated by box 240; forming the electrical interconnect layer 125 to form interconnects as diagrammatically illustrated by box 250; and forming the top bonding layer 116 on the top of the electrical interconnect layer 125, as diagrammatically illustrated by box 260.

When the MCM 130 is ready to be separated from the reusable carrier substrate 111, the light source 122 illuminates the adhesive 112 with the illuminating beam 124. According to the preferred aspect of the invention, the light source 122 is a 248 nm KrF or 308 nm XeCl excimer laser creating the illuminating beam 124 of light of 248 nm or 308 nm, respectively, that ablates the adhesive 112 made from BCB.

According to the preferred teachings of the present invention, the top bonding layer 116 is fabricated as diagrammatically illustrated by box 260, shown in FIG. 8. According to the preferred teachings of the present invention, the top bonding layer 116 can be pads, solder bumps, or gold bumps as needed for attachment to the next level of packaging. The panel format following the preferred teachings of the invention allow printed circuit board equipment to be used for the photolithography and wet processes. This ability to use printed circuit board equipment reduces production costs because printed circuit board equipment is considerably less expensive than integrated circuit manufacturing equipment.

Solder bumps or gold bumps can be added to the pad layer. Single integrated circuits (ICs) interconnected using the methods of the preferred teachings of the present invention can have a thin film layer added that redistributes the location of chip interconnects from the original pad locations to new locations. For example, a group of ICs with peripheral pads can have a redistribution layer added so that the new pads are configured as an area array that connect to the ICs through a thin film interconnection layer. The ICs can be separated from each other either before or after they are released from the carrier. After redistribution MCMs 130 are released from the reusable carrier substrate 111, other post processing can be done. In one example post processing procedure a heat sink can be attached to the MCM 130. In another example post processing procedure, solder or conductive adhesive can be put on the pads of the top bonding layer 116.

Figure 5:
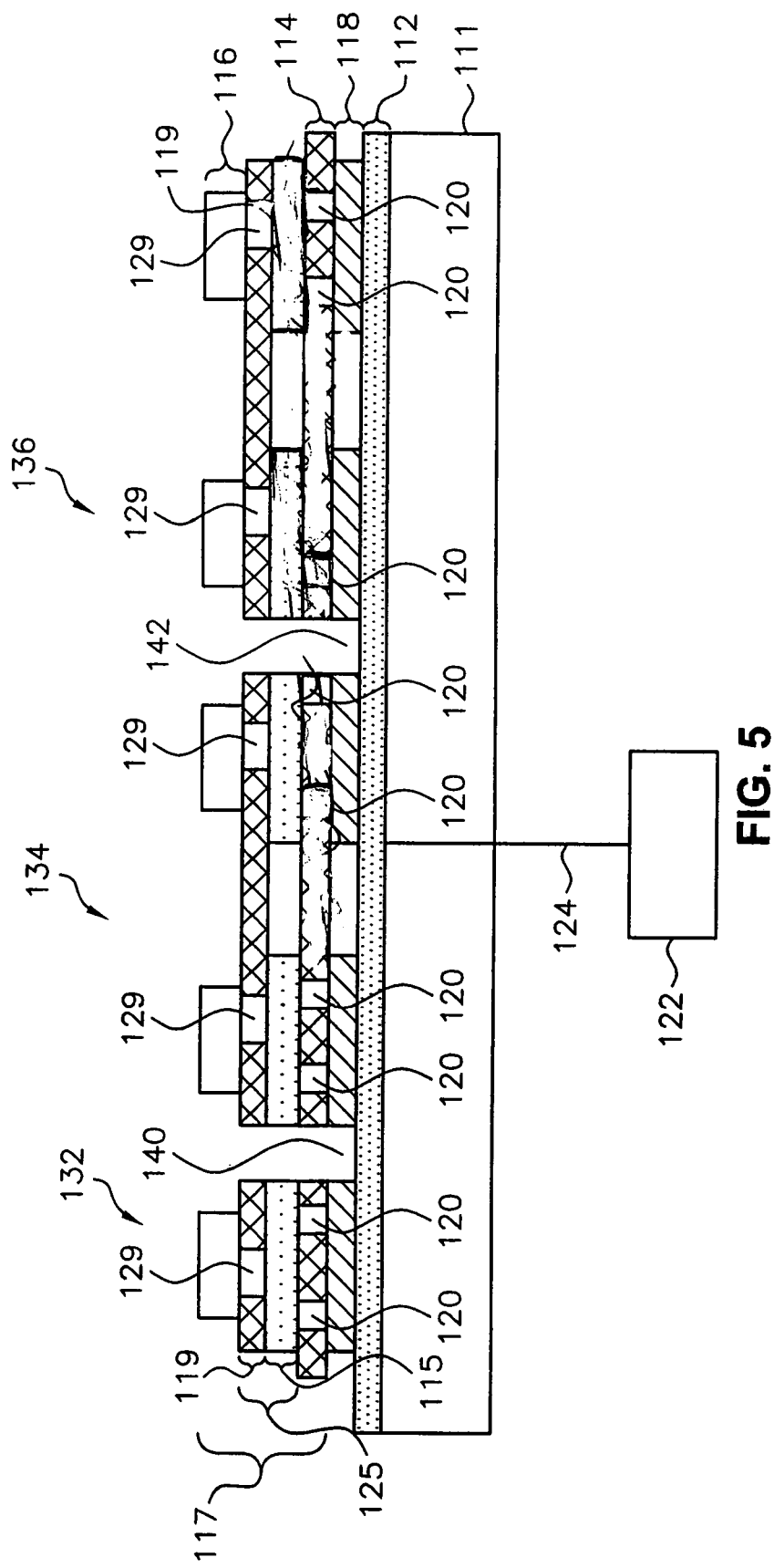
FIG. 5 shows a side view of a plurality of multicomponent modules being detached by an excimer laser.

Refer now to FIG. 5, which shows a side view of a single chip module 132, a first multi-chip module 134, and a second multi-chip module 136 under construction by the methods according to the preferred teachings of the present invention. The single chip module 132, the first multi-chip module 134, and the second multi-chip module 136 are constructed on the reusable carrier substrate 111 following the methods used to create the MCM 130. The single chip module 132, the first multi-chip module 134, and the second multi-chip module 136 are separated while still attached to the reusable carrier substrate 111. As diagrammatically illustrated by box 275, during the creation of the electrical interconnect layer 125, the interconnect dielectric layer 119, formed from a spin on polyimide such as PI-2611 from H.D. MicroSystems, is masked and then the surface is etched to create streets 140 and 142. Street 140 separates the single chip module 132 and the first multi-chip module 134, and street 142 separates the first multi-chip module 134 from the second multi-chip module 136.

The light source 122 provides the illuminating beam 124 to release the single chip module 132, the first multi-chip module 134, and the second multi-chip module 136 from the reusable carrier substrate 111 by ablating the adhesive 112 following the teachings of the present invention. The single chip module 132, the first multi-chip module 134, and the second multi-chip module 136 separate from each other because the adhesive 112 layer is very thin and breaks. The adhesive 112 layer is on the order of microns while the electronic components are between 5-26 mils, for example. In the case where a thicker adhesive is used, the adhesive 112 can be deposited only in the locations where the components on the component layer 118 are to be placed. Alternatively, the adhesive 112 can be removed from between MCMS 130 either right after component placement or right after the streets 140 and 142 are formed. The single chip module 132, the first multi-chip module 134, and the second multi-chip module 136 are then available to be separately post processed.

Figure 6:
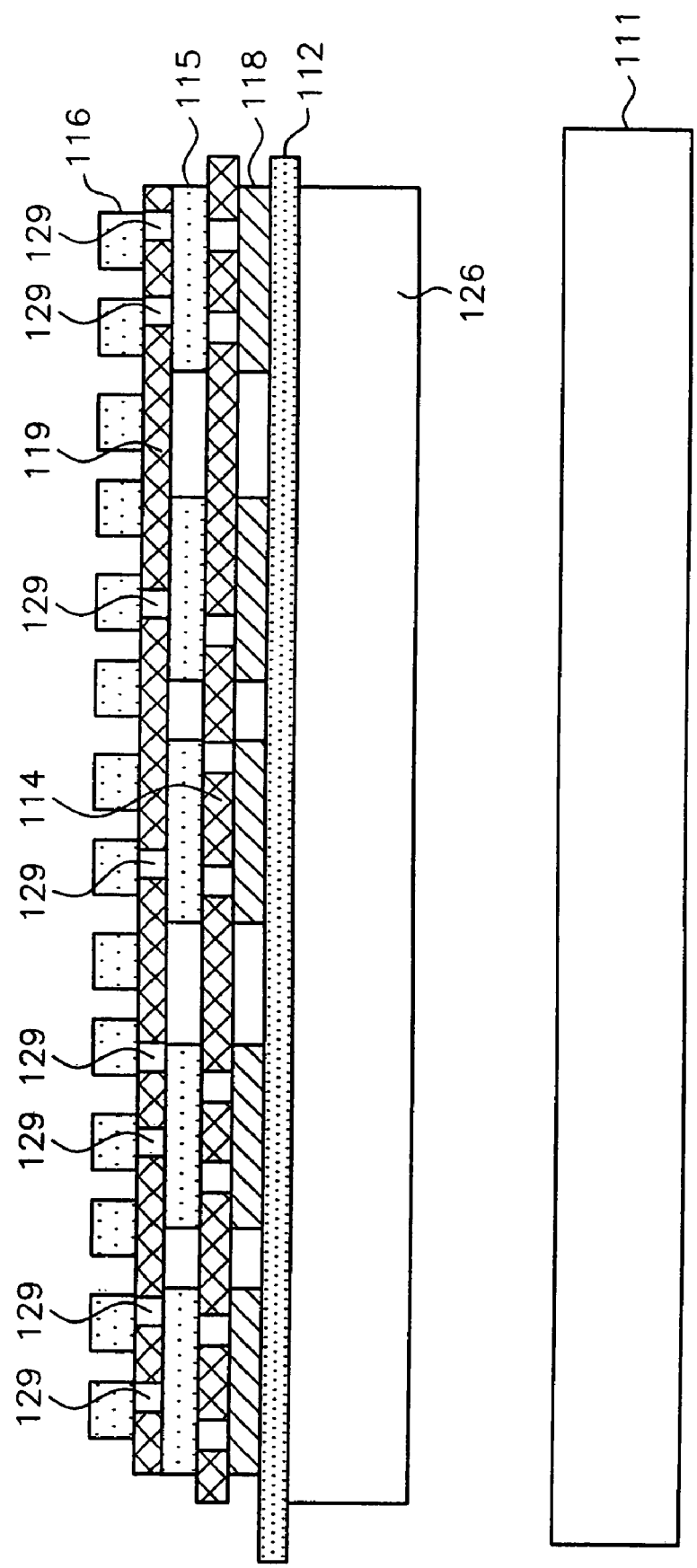
FIG. 6 shows a side view of a multicomponent module detached from a reusable carrier substrate.

FIG. 6 shows a side view of the reusable carrier substrate 111, with the adhesive 112 removed, the electronic components in the component layer 118, the dielectric layer 114 which according to the preferred teachings of the present invention can be a polymeric dielectric layer with vias 120, the electrical interconnect layer 125, and the top bonding layer 116. As diagrammatically illustrated by box 270, shown in FIG. 8, after the thin film interconnect layer 125 has been added, the MCM 130 is ready to be released from the reusable carrier substrate 111. An excimer laser can be used to release the MCM 130 from the reusable carrier substrate 111. According to the preferred embodiment of the present invention, the 248 nm KrF or 308 nm XeCl excimer laser passes through the back of the reusable carrier substrate 111 and ablates the adhesive 112 that attaches the chips to the reusable carrier substrate 111. If the laminate film was etched out around each MCM 130 during the thin film interconnect process, the MCM 130 is separated upon release from the reusable carrier substrate 111. If desired, the MCM 130 can be cleaned using standard techniques to remove the adhesive 112, particles or handling contamination and can be attached to the heat spreader 126 to further improve its thermal characteristics. Different adhesives ablate at different interfaces. According to the preferred teachings of the present invention the adhesive 112 ablates at the reusable carrier substrate 111 and remains on the components of the component layer 118. In other instances the adhesive 112 can remain on the reusable carrier substrate 111 after ablation or on the components of the component layer 118.

Figure 7:
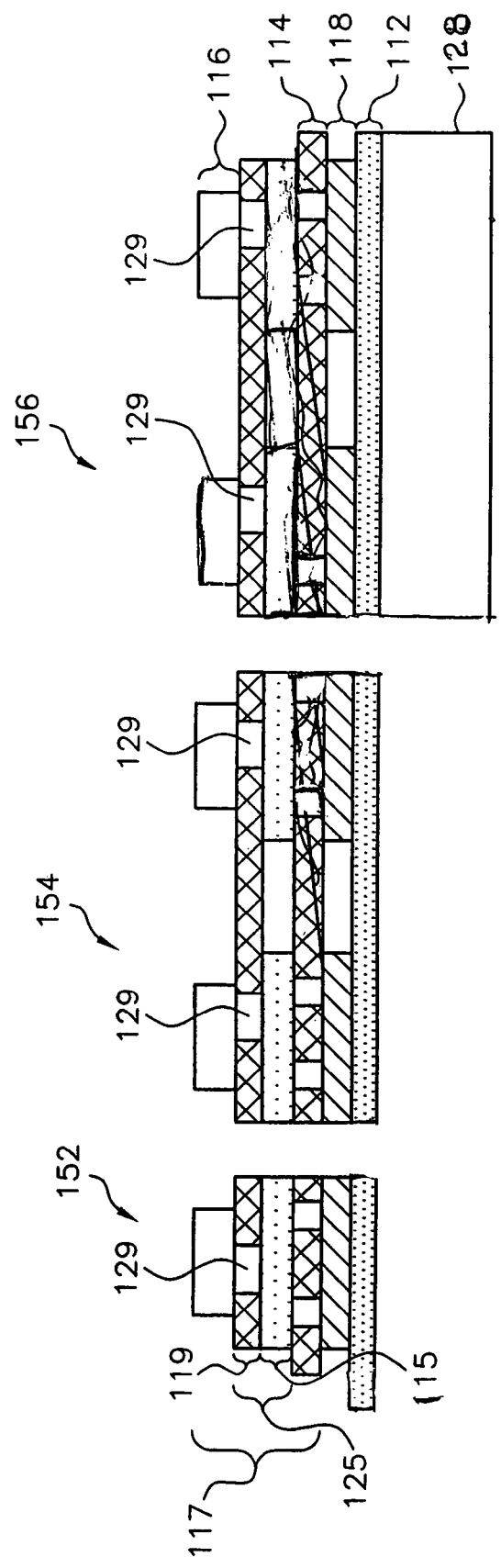
FIG. 7 shows a side view of a plurality of multicomponent modules detached from a reusable carrier substrate.

Refer now to FIG. 7, which shows a side view of a single chip module 152, a first multi-chip module 154, and a second multi-chip module 156 under construction by the methods according to the preferred teachings of the present invention. The single chip module 152, the first multi-chip module 154, and the second multi-chip module 136 are constructed on the reusable carrier substrate 111 following the methods used to create the MCM 130. As diagrammatically illustrated by box 285, the single chip module 152, the first multi-chip module 154, and the second multi-chip module 156 are separated after being detached from the reusable carrier substrate 111. A heat spreader 128 is attached to the multi-chip module 156. After ablation and separation from the reusable carrier substrate 111 the single-chip module 152 can be separated from the first multi-chip module 154 by mechanical means such as cutting with a knife, such as an exacto knife, also the separation procedure can be accomplished with laser cutting, and laser cutting without a mask.

Methods according to the preferred teachings of the present invention allow groups of integrated circuits and components in the component layer 118 to be interconnected to each other to form single chip modules 152, multi-chip modules 154, and 156 or multi-component modules 130. The MCMs 130 can be separated from each other before or after release from the reusable carrier substrate 111.

The methods of the invention are useful for producing MCM's in volume at lower cost.

There are several advantages over the existing techniques used for fabrication. The reusable carrier substrate 111 reduces production costs because the reusable carrier substrate 111 can be used again to make another MCM 130. The reusable carrier substrate 111 is a large panel allowing a larger quantity of MCMS 130 to be built on a single substrate 111. Production costs are based on the reusable carrier substrate 111 not on the individual MCMS 130; therefore, increasing the number of MCMS 130 per reusable carrier substrate 111 reduces the overall production cost per MCM 130. The panel format allows for the use of printed circuit board (PCB) equipment for the photolithography and metal patterning operations. PCB equipment is less expensive than the equivalent semiconductor processing equipment used to handle wafers. Printed circuit board processes are also less expensive. The labor costs are reduced because fewer reusable carrier substrates 111 are handled. The photolithography related chemicals are three times less costly than those used to process integrated circuit (I.C.) wafers. The MCM 130 itself has better thermal characteristics because the I.C. is not insulated by the reusable carrier substrate 111.

Other examples of post-processing could include screening of solder or conductive adhesive on the pads.

In summary refer now to FIG. 8 that diagrammatically shows methods to construct die first MCMs 130. Methods 200 start by forming alignment marks 110 onto the reusable carrier substrate 111 as diagrammatically illustrated by box 210. The adhesive 112 is placed on the reusable carrier substrate 111 as diagrammatically illustrated by box 220. Electronic components in the component layer 118 are placed onto the reusable carrier substrate 111 as diagrammatically illustrated by box 230. The interconnect structure 117 is fabricated including, in the preferred form, the dielectric layer 114, the electrical interconnect layer 125 and the top bonding layer 116 as diagrammatically illustrated by box 255. Alternately, as diagrammatically illustrated by box 275, multiple MCMs 130 may be separated before release from the reusable carrier substrate 111. The MCM 130 is then released from the reusable carrier substrate 111 as diagrammatically illustrated by box 270. Alternately, as diagrammatically illustrated by box 285, multiple MCMs 130 may be separated after release from the reusable carrier substrate 111. The MCM 130 is prepared for further processing free of the reusable carrier substrate 111 which can include attachment of the heat spreader 126 as diagrammatically illustrated by box 280.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

The invention claimed is:

1. Method of making a module comprising:
providing a reusable carrier substrate, with the reusable carrier substrate being light transmissive in a frequency range;
providing a first electronic component;
adhering the first electronic component to the reusable carrier substrate with an adhesive that is able to be ablated by light in the frequency range;
fabricating an interconnect structure on the first electronic component to form the module; and
illuminating the reusable carrier substrate with the light in the frequency range, after fabricating the interconnect structure and after adhering the first electronic component, to ablate the adhesive to remove the module from the reusable carrier substrate to allow reuse of the reusable carrier substrate.

2. The method of claim 1 further comprising:
providing a second electronic component; and
adhering the second electronic component to the reusable carrier substrate with an adhesive that is able to be ablated by light in the frequency range.

3. The method of claim 2 with adhering the second electronic component comprising adhering the second electronic component with the adhesive used to adhere the first electronic component.

4. The method of claim 2 with providing the first electronic component comprising providing the first electronic component in the form of an integrated circuit.

5. The method of claim 4 with providing the second electronic component comprising providing the second electronic component in the form of an integrated circuit.

6. The method of claim 1 with providing the first electronic component comprising providing the first electronic component in the form of an integrated circuit.

7. The method of claim 1 with illuminating the reusable carrier substrate comprising illuminating the reusable carrier substrate to remove the module from the reusable carrier substrate with the module being free of a carrier substrate to allow for improved thermal characteristics.

8. The method of claim 1 with providing the reusable carrier substrate comprises providing the reusable carrier substrate having a first thermal expansion coefficient in a thermal expansion coefficient range, and with providing the first electronic component comprising providing the first electronic component having a second thermal expansion coefficient in the thermal expansion coefficient range.

9. The method of claim 1 with adhering the first electronic component comprising adhering the first electronic component to the reusable carrier substrate with the adhesive made from bisbenzocyclobutene.

10. The method of claim 1 with adhering the first electronic component comprising adhering the first electronic component by extruding the adhesive on the reusable carrier substrate.

11. The method of claim 1 with adhering the first electronic component comprising adhering the first electronic component by spinning the adhesive on the reusable carrier substrate.

12. The method of claim 1 with providing the reusable carrier substrate comprising providing the reusable carrier substrate made from glass.

13. The method of claim 1 with providing the reusable carrier substrate comprising providing the reusable carrier substrate made from quartz.

14. The method of claim 1 with providing the reusable carrier substrate comprising providing the reusable carrier substrate made from fused silica.

15. The method of claim 1 with fabricating the interconnect structure comprising fabricating the interconnect structure by laminating a dielectric material to the first electronic component.

16. The method of claim 1 with fabricating the interconnect structure comprising fabricating the interconnect structure by forming thin film interconnects to the first electronic component.

17. The method of claim 1 with fabricating the interconnect structure comprising fabricating the interconnect structure by forming a top bonding layer to connect to the first electronic component.

18. The method of claim 1 with fabricating the interconnect structure comprising fabricating the interconnect structure in the form of thin film interconnect to form a ground plane, a power plane, and a signal layer.

19. The method of claim 1 with fabricating the interconnect structure comprising fabricating the interconnect structure in the form of a dielectric and a conductor.

20. The method of claim 1 with fabricating the interconnect structure comprising fabricating the interconnect structure in the form of a dielectric and a conductor with the dielectric in the form of a polyimide.

21. The method of claim 1 with fabricating the interconnect structure comprising fabricating the interconnect structure in the form of a dielectric and a conductor, with the dielectric in the form of bisbenzocyclobutene.

22. The method of claim 1 further comprising preparing the module for further processing free of a carrier substrate.

23. The method of claim 1 with illuminating the reusable carrier substrate comprising illuminating the reusable carrier substrate with light in a 248 nm range.

24. The method of claim 1 with illuminating the reusable carrier substrate comprising illuminating the reusable carrier substrate with light in a 308 nm range.

25. The method of claim 1 with illuminating the reusable carrier substrate comprising illuminating the reusable carrier substrate with light from an excimer laser.

26. The method of claim 1 with providing a reusable carrier substrate comprising providing a reusable carrier substrate having alignment marks for alignment of the first electronic component.

27. The method of claim 1 further comprising providing a plurality of electronic components with at least one of the plurality of electronic components is connected to the first electronic component and at least one of the plurality of electronic components is not connected to the first electronic component.

28. The method of claim 27 further comprising separating the first electronic component and the at least one of the plurality of electronic components connected to the first electronic component from the at least one electronic component not connected to the first electronic component.

29. The method of claim 28 with the separating comprising etching the interconnect structure.

30. The method of claim 28 with separating comprising separating the first electronic component and the at least one of the plurality of electronic components connected to the first electronic component from the at least one electronic component not connected to the first electronic component after illuminating the reusable carrier substrate with the light in the frequency range.

31. The method of claim 30 with the separating comprising cutting the interconnect structure.

* * * * *